US010510749B1

(12) United States Patent
Zang et al.

(10) Patent No.: US 10,510,749 B1
(45) Date of Patent: Dec. 17, 2019

(54) RESISTOR WITHIN SINGLE DIFFUSION BREAK, AND RELATED METHOD

(71) Applicant: GLOBALFOUNDRIES INC., Grand Cayman (KY)

(72) Inventors: Hui Zang, Guilderland, NY (US); Ruilong Xie, Schenectady, NY (US); Laertis Economikos, Wappingers Falls, NY (US); Garo J. Derderian, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/057,881

(22) Filed: Aug. 8, 2018

(51) Int. Cl.
*H01L 29/76* (2006.01)
*H01L 27/06* (2006.01)
*H01L 29/78* (2006.01)
*H01L 49/02* (2006.01)
*H01L 21/8234* (2006.01)
*H01L 29/66* (2006.01)
*H01L 29/06* (2006.01)

(52) U.S. Cl.
CPC .. *H01L 27/0629* (2013.01); *H01L 21/823481* (2013.01); *H01L 28/24* (2013.01); *H01L 29/0649* (2013.01); *H01L 29/66545* (2013.01); *H01L 29/66795* (2013.01); *H01L 29/785* (2013.01)

(58) Field of Classification Search
None
See application file for complete search history.

(56) References Cited

U.S. PATENT DOCUMENTS

| 8,846,491 | B1 | 9/2014 | Pham et al. |
| 8,916,460 | B1 | 12/2014 | Kwon et al. |
| 9,105,685 | B2 | 8/2015 | Lin et al. |
| 2010/0059823 | A1* | 3/2010 | Chung ............ H01L 21/823878 257/355 |
| 2014/0117454 | A1 | 5/2014 | Liu et al. |
| 2016/0190130 | A1 | 6/2016 | Yu et al. |
| 2018/0096994 | A1* | 4/2018 | Bi ...................... H01L 29/4966 |

* cited by examiner

*Primary Examiner* — Hung K Vu
(74) *Attorney, Agent, or Firm* — Francis Pagette; Hoffman Warnick LLC

(57) ABSTRACT

A resistor for an integrated circuit (IC), an IC and a related method are disclosed. The resistor may include a metal alloy resistor body positioned within a single diffusion break (SDB). The SDB provides an isolation region in a semiconductor fin between a pair of fin-type field effect transistors (finFETs). The resistor in the SDB allows for the resistor to be built at front-end-of-line (FEOL) layers, which saves on space and expense, and allows for precise dimensions for the resistor.

12 Claims, 9 Drawing Sheets

RESISTOR WITHIN SINGLE DIFFUSION BREAK, AND RELATED METHOD

BACKGROUND

The present disclosure relates to integrated circuits, and more specifically, to a resistor within a single diffusion break (SDB), an IC including the resistor and a related method.

Advanced manufacturing of ICs requires formation of individual circuit elements, e.g., transistors such as field-effect-transistors (FETs) and the like, based on specific circuit designs. A FET generally includes source, drain, and gate regions. The gate region is placed between the source and drain regions and controls the current through a channel region (often shaped as a semiconductor fin) between the source and drain regions.ABI Gates may be composed of various metals and often include a work function metal which is chosen to create desired characteristics of the FET. Transistors may be formed over a substrate and may be electrically isolated with an insulating dielectric layer, e.g., inter-level dielectric (ILD) layer. Contacts may be formed to each of the source, drain, and gate regions through the dielectric layer in order to provide electrical connection between the transistors and other circuit elements that may be formed subsequent to the transistor in other metal levels. Resistors for an IC are oftentimes formed in ILD layers above the FETs. These layers are referred to as middle-of-line (MOL) layers and back-end-of-line (BEOL) layers. MOL layers are just above the front-end-of-line (FEOL) layers that include the FETs, and BEOL layers are above the MOL layers. Both MOL and BEOL layers provide scaling interconnects for the IC. Formation of the resistors in the MOL or BEOL layers requires a number of steps, e.g., masking, etching and depositing of materials, that adds to the complexity of the overall process and can reduce the yield window for these layers. The resistors also add thickness to the layers.

Fin-type field effect transistors ("FinFETs") have become increasingly widespread because FinFETs offer better electrostatic control over the behavior in the channel than planar FETs. FinFETs are formed by creating a number of semiconductor fins on a substrate and placing a gate conductor perpendicularly across the fins. A FinFET is created by the gate forming a channel region below the gate in the fin, and source/drain regions formed in the fin aside the gate. A particular fin may be used to fabricate multiple devices by forming one or more diffusion breaks along the axial length of a fin, thus defining separate fin portions/devices by removing a portion of the fin and replacing it with a dielectric material. A diffusion break having a lateral width corresponding to the lateral width of one gate structure is referred to as a single diffusion break (SDB).

SUMMARY

A first aspect of the disclosure is directed to an integrated circuit (IC), comprising: a plurality of semiconductor fins on a substrate, at least one semiconductor fin being part of at least one finFET; a single diffusion break (SDB) in a selected one of the plurality of semiconductor fins; and a resistor positioned within the SDB.

A second aspect of the disclosure includes a resistor for an integrated circuit (IC), the resistor comprising: a metal alloy resistor body positioned within a single diffusion break (SDB), the SDB providing an isolation region in a semiconductor fin between a pair of fin-type field effect transistors (finFETs).

A third aspect of the disclosure related to a method, comprising: providing a precursor structure including a semiconductor fin on a substrate, a dummy gate extending perpendicularly over the semiconductor fin, and a pair of gate cut isolations spaced in the dummy gate; forming a single diffusion break (SDB) opening between the pair of gate cut isolations by removing a portion of the dummy gate extending over the semiconductor fin and removing a portion of the semiconductor fin thereunder; filling the SDB opening with a dielectric to form an SDB; forming a resistor opening in the SDB by removing a portion of the dielectric of the SDB, leaving a remaining portion of the dielectric between the pair of gate cut isolations; forming a metal alloy resistor material in the resistor opening; removing the metal alloy resistor material in the resistor opening below an upper surface of the pair gate cut isolations; forming a dielectric cap layer over the metal alloy resistor material; and forming a pair of contacts to the metal alloy resistor material through the dielectric cap layer.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

Embodiments of a resistor for an integrated circuit (IC), an IC including the resistor, and a related method are disclosed. The resistor may include a metal alloy resistor body positioned within a single diffusion break (SDB). The SDB provides an isolation region in a semiconductor fin between a pair of fin-type field effect transistors (finFETs). The resistor in the SDB allows for the resistor to be built in front-end-of-line (FEOL) layers, which saves on space, can improve yield of MOL and BEOL layers, and reduces expense by eliminating additional mask processes. In addition, the resistor position in the FEOL layers, rather than the MOL layers, allows use of transistors that would normally be blocked from use by the resistor, i.e., because they would be below the resistor. Further, formation of the resistor in the SDB at the FEOL layers allows for greater critical dimension (CD) precision typically employed at those layers to be applied to more dimension the resistor and more precisely select its resistance.

Figure 1A:
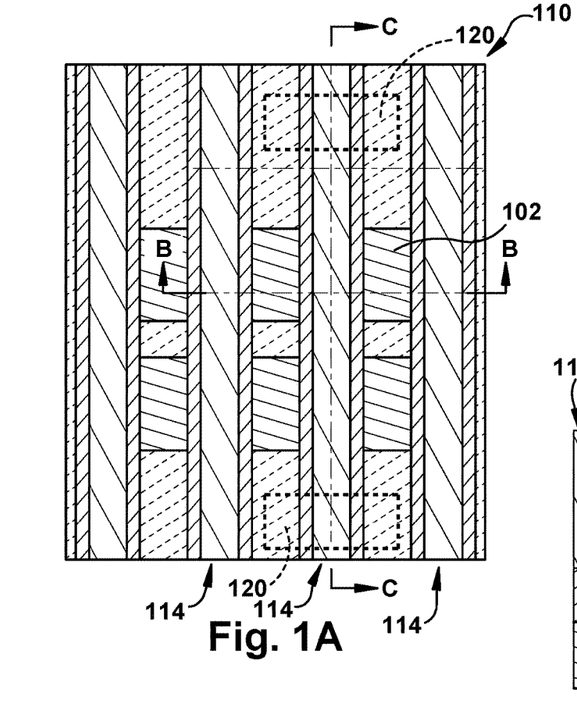
FIGS. 1A-C show a plan and two cross-sectional views, respectively, of a precursor structure for a method, according to embodiments of the disclosure.
Figure 1B:
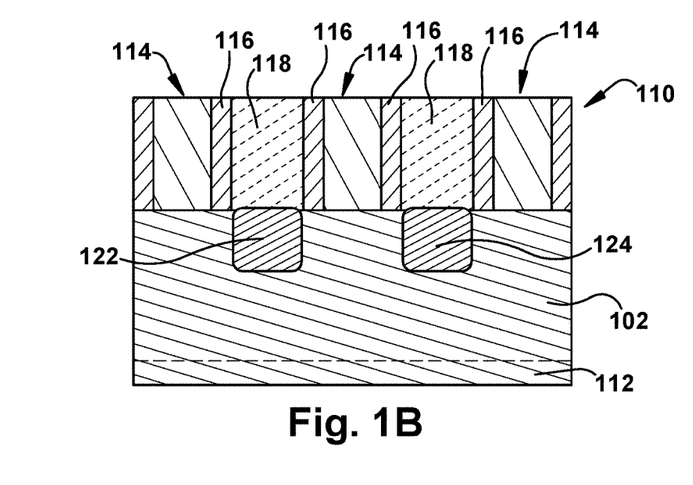
Figure 1C:
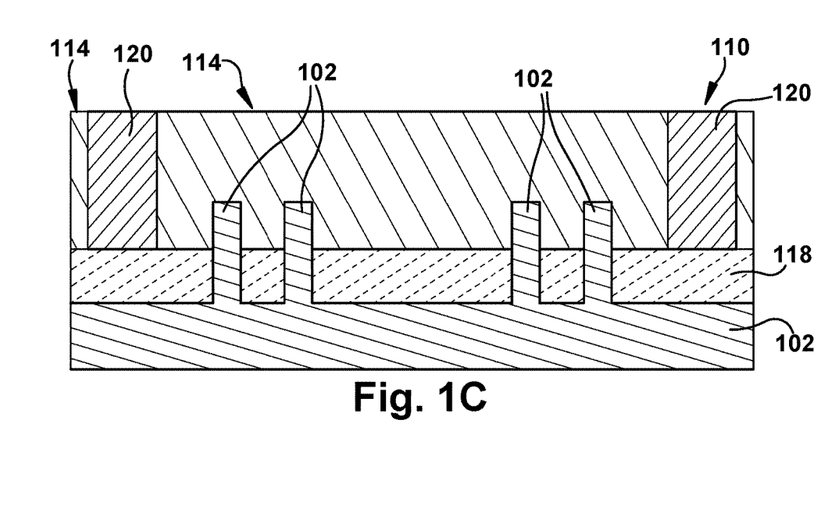

For purposes of describing the method according to embodiments of the disclosure, those drawings labeled with a numeral and an 'A', e.g., FIG. 1A, show a plan view of the structure; those drawings labeled with a corresponding numeral and a 'B', e.g., FIG. 1B, show a cross-sectional view along line B-B in the correspondingly numbered drawing labeled 'A'; and those drawings labeled 'C' show a cross-sectional view along line C-C of the correspondingly numbered drawing labeled 'A'. Generally speaking, cross-section B-B extends length-wise along part of a semiconductor fin. Further, cross-section C-C extends length-wise along a gate position, which depending on the process timing may include, for example, a dummy gate or the resistor within the SDB. It will be noted that the plan views of drawings labeled 'A' may show certain underlying layers but not others, for clarity.

FIGS. 1A-C show a precursor structure 110 including a semiconductor fin(s) 102 on a substrate 112 (FIG. 1B only). Substrate 112 and semiconductor fin(s) 102 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained. Semiconductor fin(s) 102 may be made using any now known or later developed process, e.g., epitaxial growth through a template, or etching to form them from substrate 112.

Precursor structure 110 may also include a dummy gate 114 extending perpendicularly over semiconductor fin(s) 102. As understood in the art, a plurality of semiconductor fins 102 can have a plurality of dummy gates 114 extending thereover. Dummy gates 114 provide sacrificial material that will be replaced to form final high dielectric (high-K) metal gates as part of a replacement metal gate (RMG) process, described elsewhere herein. The sacrificial material is exposed to processing, e.g., anneals to drive in dopants into source/drain regions in semiconductor fin(s) 102, that would damage the material of the high-K metal gates. Dummy gate 114 may include any now known or later developed sacrificial dummy gate material, e.g., a thin barrier liner (not shown), and a filler of amorphous silicon or polysilicon. As shown best in FIG. 1B, each dummy gate 114 may include a spacer 116 isolating it from a shallow trench isolation (STI) 118, i.e., a dielectric, that separates dummy gates 114 and spacers 118 from each other. Spacer 116 may include any now known or later developed spacer material, e.g., silicon nitride or silicon oxide. STI 118 may be formed of any currently-known or later developed substance for providing electrical insulation, and as examples may include: silicon nitride ($Si_3N_4$), silicon oxide ($SiO_2$), fluorinated $SiO_2$ (FSG), hydrogenated silicon oxycarbide (SiCOH), porous SiCOH, boro-phospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, a spin-on silicon-carbon containing polymer material, near frictionless carbon (NFC), or layers thereof.

Precursor structure 110 may also include a pair of gate cut isolations 120 that are spaced in dummy gate 114 (only shown in one dummy gate in FIG. 1A). As understood in the art, and as shown in FIG. 1C, gate cut isolations 120 include dielectric material, e.g., silicon nitride, that extends vertically through dummy gate 114 to isolate later formed high-K metal gates and create isolated transistors (e.g., 184 in FIGS. 9A, 9C). FIG. 1B also shows source/drain (S/D) regions 122, 124 in semiconductor fin 102. As understood in the art, S/D regions 122, 124 may include any appropriate dopant(s), and may be formed using any now known or later developed processes, e.g., doping via ion implantation or in-situ deposition, epitaxial growth, etc.

"Depositing" or "deposition" may include any now known or later developed techniques appropriate for the material to be formed including but are not limited to, for example: chemical vapor deposition (CVD), low-pressure CVD (LPCVD), plasma-enhanced CVD (PECVD), sub-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Precursor structure 110 may be formed using any now known or later developed semiconductor fabrication process, e.g., photolithography or sidewall image transfer patterning, etching, ion implanting, epitaxy, material deposition, planarization, etc. In lithography (or "photolithography"), a radiation or photo sensitive "resist" coating is formed over one or more layers which are to be treated, in some manner, such as to be selectively doped, etched, and/or to have a pattern transferred thereto. The resist, which is sometimes referred to as a photoresist, is itself first patterned by exposing it to radiation, where the radiation (selectively) passes through an intervening mask or template containing the pattern. As a result, the exposed or unexposed areas of the resist coating become more or less soluble, depending on the type of photoresist used. A developer is then used to remove the more soluble areas of the resist leaving a patterned resist. The patterned resist can then serve as a mask for the underlying layers which can then be selectively treated, such as to receive dopants and/or to undergo etching.

"Etching" generally refers to the removal of material from a substrate (or structures formed on the substrate), and is often performed with a mask in place so that material may selectively be removed from certain areas of the substrate, while leaving the material unaffected, in other areas of the substrate. There are generally two categories of etching, (i)

wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g. silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. Reactive-ion etching (RIE) operates under conditions intermediate between sputter and plasma etching and may be used to produce deep, narrow features, such as STI trenches. In the instant process, mandrel material layer may be etched using RIE, for example.

Figure 2A:
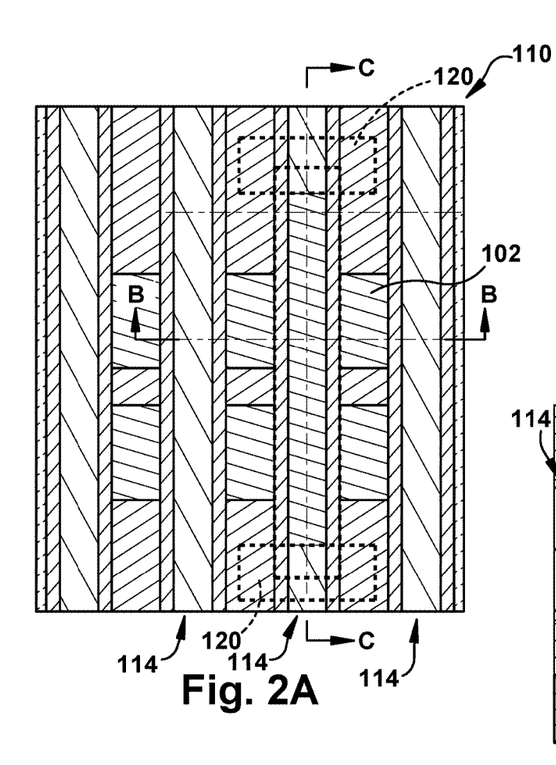
FIGS. 2A-C show a plan and two cross-sectional views, respectively, of forming a single diffusion break (SDB) opening, according to embodiments of the disclosure.
Figure 2B:
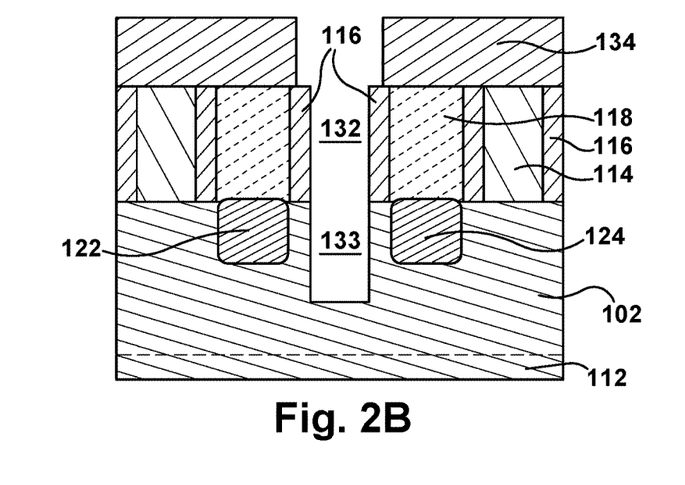
Figure 2C:
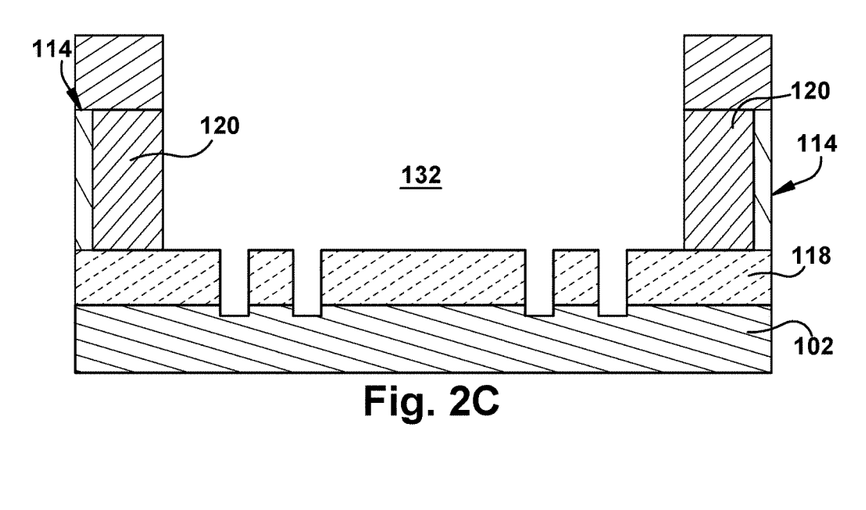
Figure 3A:
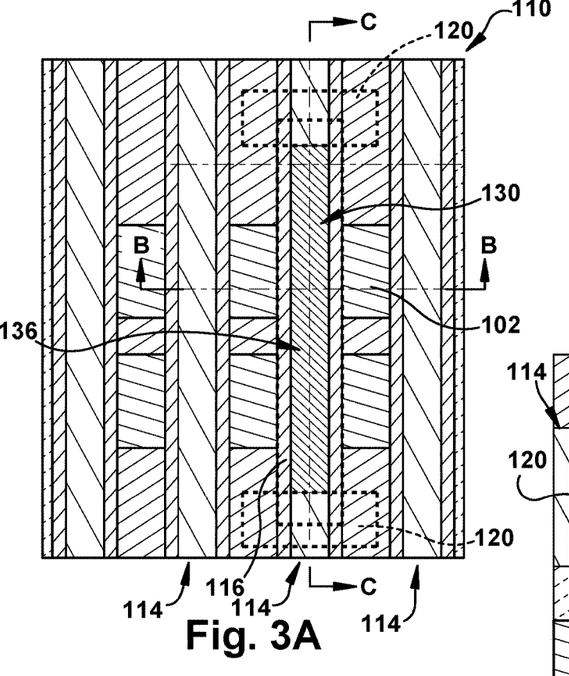
FIGS. 3A-C show a plan and two cross-sectional views, respectively, of forming an SDB dielectric, according to embodiments of the disclosure.
Figure 3B:
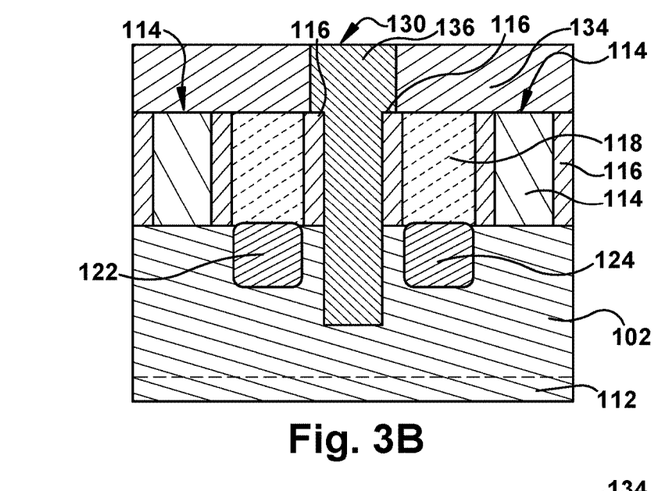
Figure 3C:
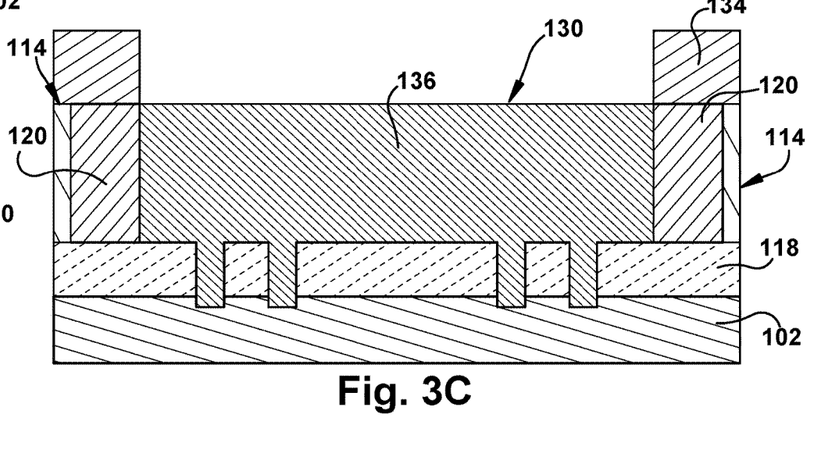

FIGS. 2A-C and 3A-C show a process according to various embodiments, including forming a single diffusion break (SDB) 130 (FIGS. 3A-C). As understood in the art, diffusion breaks 130 are formed to define separate fin portions by removing a portion of a semiconductor fin 102 and replacing it with a dielectric material. The strength of the isolation provided by the diffusion break depends on its size. A diffusion break having a wider lateral width (in the current transport direction, or gate length (GL) direction of the completed devices) corresponding to the lateral width of two adjacent gate structures (later formed) is referred to as a double diffusion break (DDB), and a diffusion break having a lateral width corresponding to the lateral width of one gate structure, as in the present disclosure, is referred to as a single diffusion break (SDB) 130.

FIGS. 2A-C show forming an SDB opening 132 between pair of gate cut isolations 120 by removing a portion of dummy gate 114 extending over semiconductor fin 102 and removing a portion 133 of semiconductor fin 102 thereunder. As shown in FIG. 2B, SDB opening 132 extends into semiconductor fin 102, to split it between S/D regions 122, 124. SDB opening 132 includes the opening between spacer 116 and portion 133 removed from semiconductor fin 102. SDB opening 132 has a width that matches that of dummy gate 114, i.e., between spacers 116. SDB opening 132 may be formed, for example, by forming a hard mask layer, patterning it, and etching it, to form hard mask 134 and form SDB opening 132. Hard mask 134 may include any now known or later developed hard mask material such as but not limited to silicon nitride, silicon dioxide, carbon, etc. Hard mask 134 may be formed using any now known or later developed deposition and patterning technique.

FIGS. 3A-C show filling SDB opening 132 (FIGS. 2A-C) with a dielectric 136 to form SDB 130. Dielectric 136 may include any now known or later developed dielectric material for an SDB. Dielectric 136 may include any of the dielectric materials listed for STI 118, herein. In one embodiment, dielectric 136 may include silicon nitride ($Si_3N_4$).

Figures 4A, 4B, 4C:
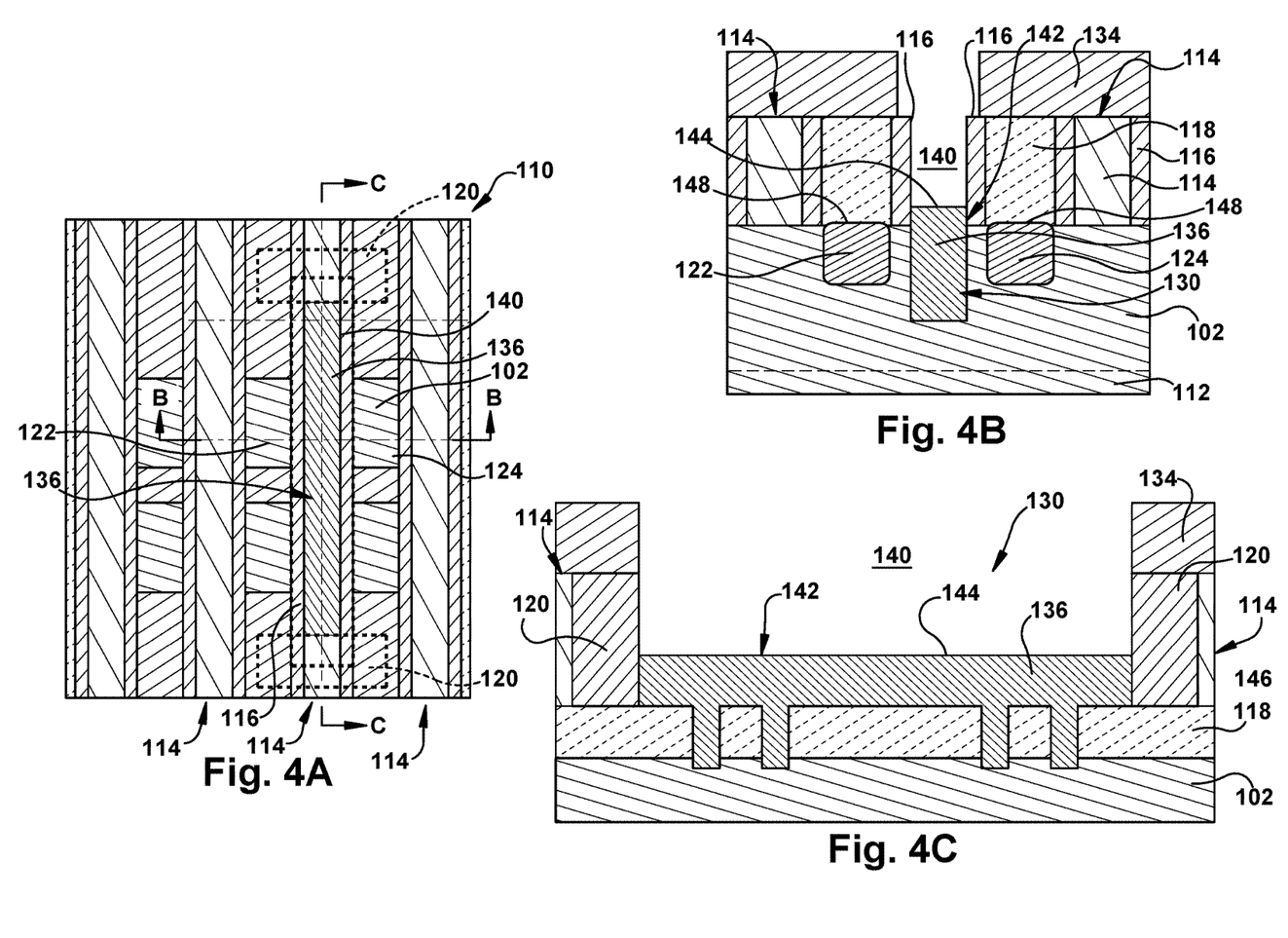
FIGS. 4A-C show a plan and two cross-sectional views, respectively, of forming a resistor opening in the SDB, according to embodiments of the disclosure.

FIGS. 4A-C show forming a resistor opening 140 in SDB 130 (FIGS. 3B-C) by removing a portion of dielectric 136 (FIGS. 3A-C) of the SDB, leaving a remaining portion 142 of dielectric 136 between pair of gate cut isolations 120. Resistor opening 140 can be formed by etching, e.g., a RIE, using hard mask 134. As shown, remaining portion 142 has an upper surface 144 above a lower end 146 (FIG. 4C) of gate cut isolations 120 and an upper surface 148 (FIG. 4B) of source/drain regions 122, 124 of semiconductor fin(s) 102. In this manner, no opening is created from SDB opening 140 to source/drain regions 122, 124 or to semiconductor fin(s) 102, which retains electrical isolation between SDB opening 140 and the other structures. Resistor opening 140 can be formed to relatively precise critical dimensions because it is being made at front-end-of-line (FEOL) layers, i.e., same layers as gates. Further, the size of the eventually formed resistor 180 (FIGS. 7A-C) and hence its resistance can be precisely selected. More particularly, in one embodiment, hard mask 134 may have the same sized opening as SDB opening 132 such that, as shown in FIG. 4C, resistor opening 140 has the same length as SDB 130, i.e., left and right ends (as illustrated) of resistor opening 140 are defined by gate cut isolations 120. In another embodiment, hard mask 134 can be replaced with another hard mask that creates different dimensions for resistor opening 140 than SDB 130. In this case, a length and thus resistance of resistor 180 (FIG. 7C) can be precisely dimensioned if the same length as SDB 130 is not desired. Here, some of dielectric 136 of SDB 130 may remain between resistor opening 140 and gate cut isolations 120 (see e.g., resistor 180 in FIG. 7C with dielectric 136 between resistor material 150 and gate cut isolations 120). Resistor opening 140 can be made any length within gate cut isolations to customize a length of resistor 180 (FIGS. 7A-C), and hence, its possible resistance.

Figure 5A:
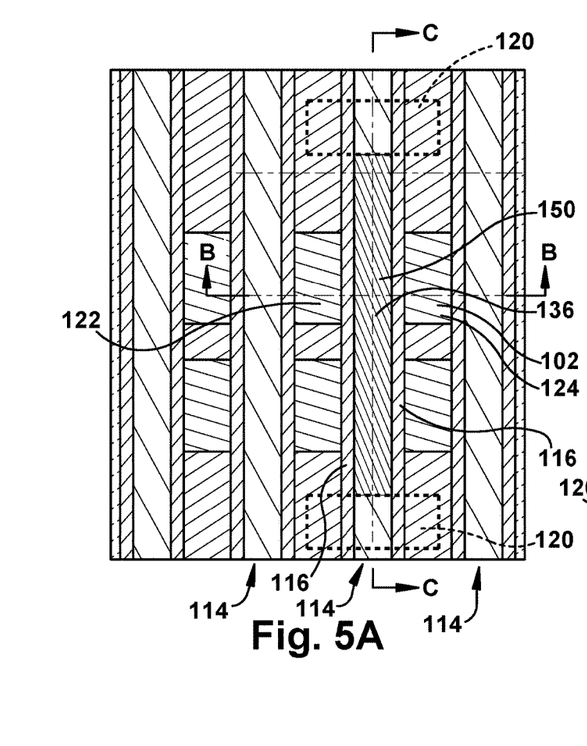
FIGS. 5A-C show a plan and two cross-sectional views, respectively, of forming a metal alloy resistive material, according to embodiments of the disclosure.
Figure 5B:
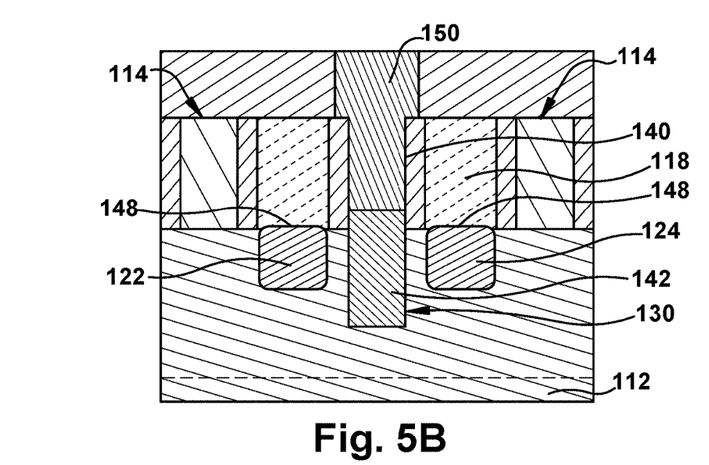
Figure 5C:
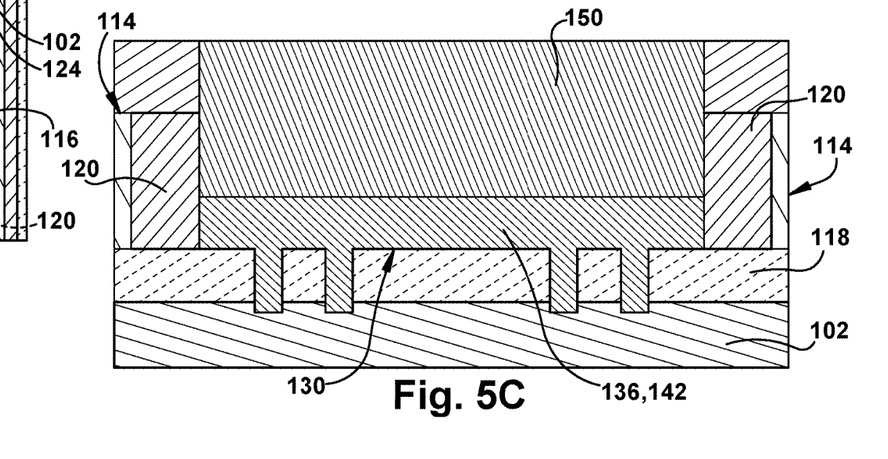

FIGS. 5A-C show forming a metal alloy resistor material 150 in resistor opening 140. Metal alloy resistor material 150, and may be formed by any appropriate deposition process, described herein, e.g., CVD. In one embodiment, resistive metal alloy material 150 may include tungsten silicide or tungsten polysilicon; however, other resistive metal alloys may be employed.

Figure 6A:
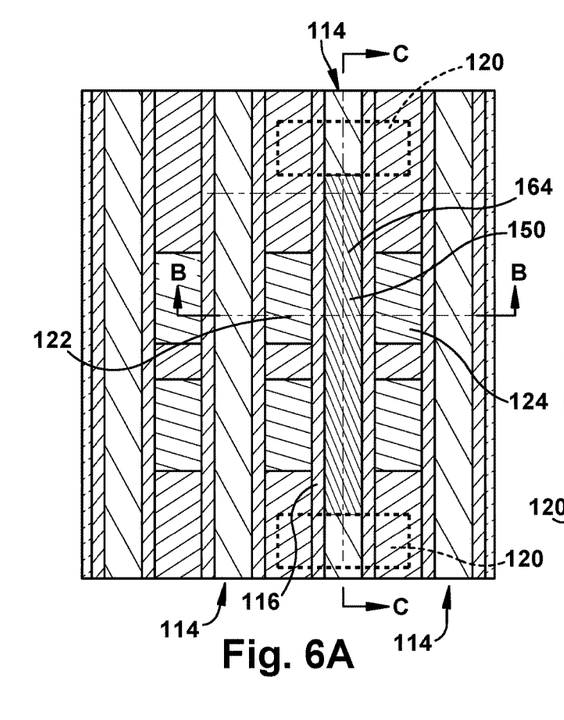
FIGS. 6A-C show a plan and two cross-sectional views, respectively, of recessing the metal alloy resistive material, according to embodiments of the disclosure.
Figure 6B:
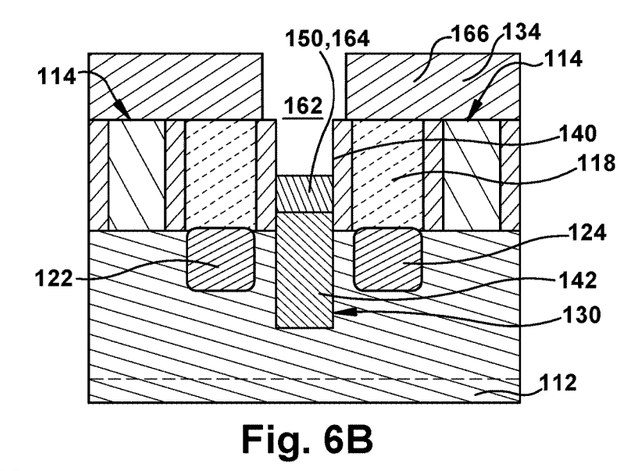
Figure 6C:
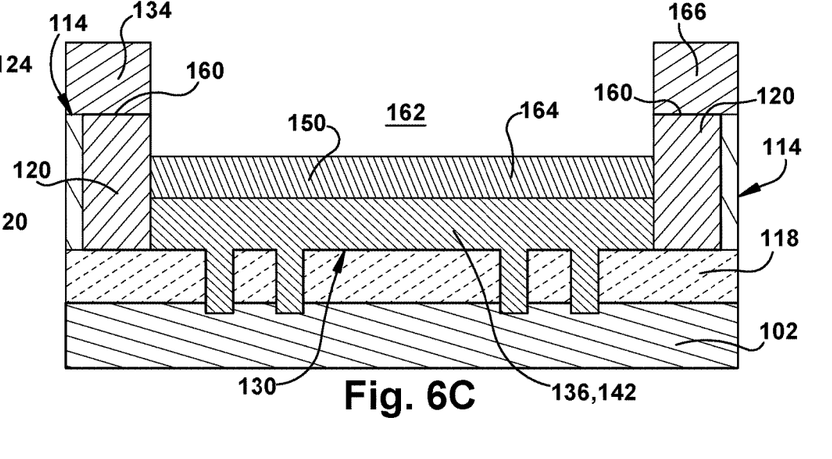

FIGS. 6A-C show removing metal alloy resistor material 150 in resistor opening 140 below an upper surface 160 (FIG. 6C only) of pair gate cut isolations 120 (and spacers 116). That is, metal alloy resistor material 150 is recessed. Removing metal alloy resistor material 150 creates a recess 162 therein, leaving a portion 164 of metal alloy resistor material 150 in resistor opening 140. Portion 164 constitutes a resistor body of resistor 180 (FIGS. 7A-C), formed therefrom. Metal alloy resistor material 150 may be removed by planarizing (not shown) metal alloy resistor material 150 to an upper surface 166 of hard mask 134, and etching to recess metal alloy resistor material 150 in resistor opening 140 below upper surface 160 of pair of gate cut isolations 120. The etching may include any appropriate etching process for the material, e.g., a RIE. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. The amount of etching used determines the height of portion 164, and thus can also determine the resistance of resistor 180 (FIGS. 7A-C).

Figure 7A:
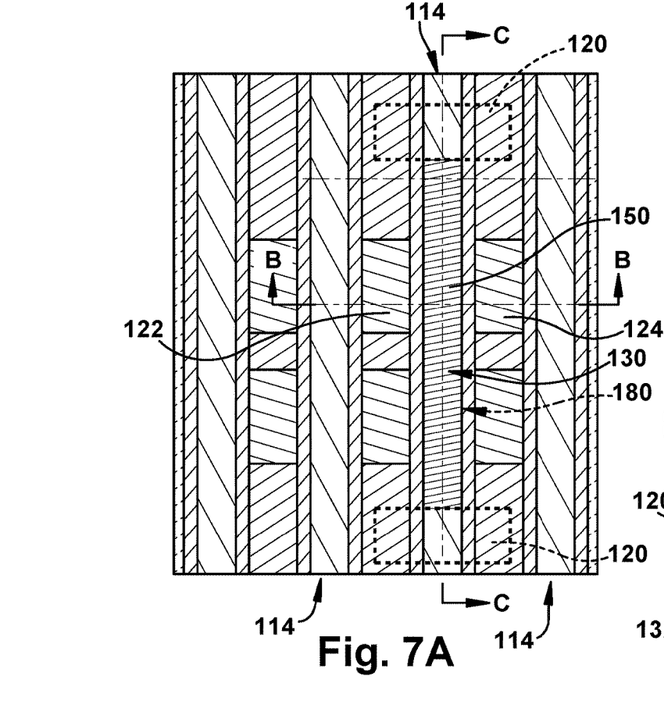
FIGS. 7A-C show a plan and two cross-sectional views, respectively, of forming a dielectric cap layer, according to embodiments of the disclosure.
Figure 7B:
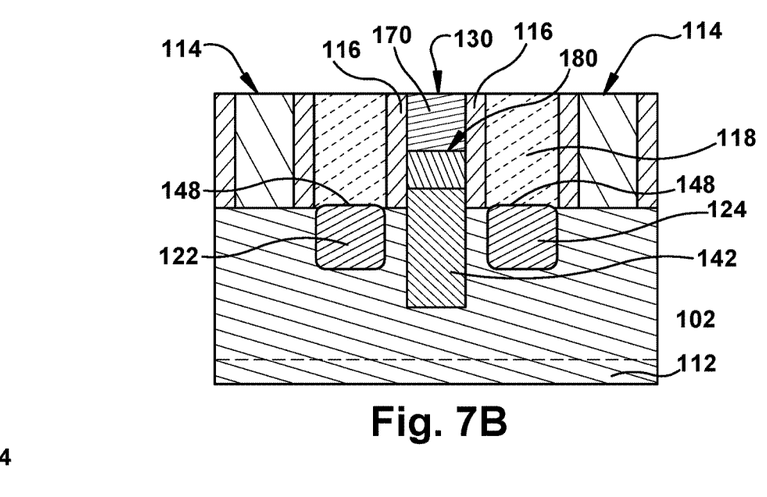
Figure 7C:
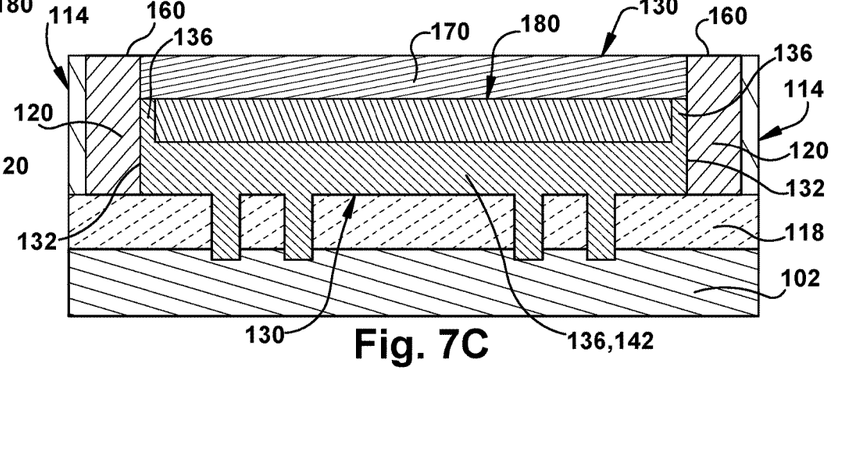

FIGS. 7A-C show forming a dielectric cap layer 170 over metal alloy resistor material 150, i.e., in recess 162 (FIG. 6B-C) of resistor opening 140. Dielectric cap layer 170 may include any now known or later developed dielectric material for an SDB, e.g., the same as dielectric 136. As noted, dielectric 136 may include any of the dielectric materials listed for STI 118, herein. In one embodiment, dielectric cap layer 170 may include silicon nitride ($Si_3N_4$). Forming dielectric cap layer 170 over metal alloy resistor material 150 may include planarizing dielectric cap layer 170 (removing hard mask 134 in process) to upper surface 160 of pair of gate cut isolations 120. At this stage, SDB 130 is reformed (top, four sides and bottom) with resistor 180 encapsulated therein.

Figure 8A:
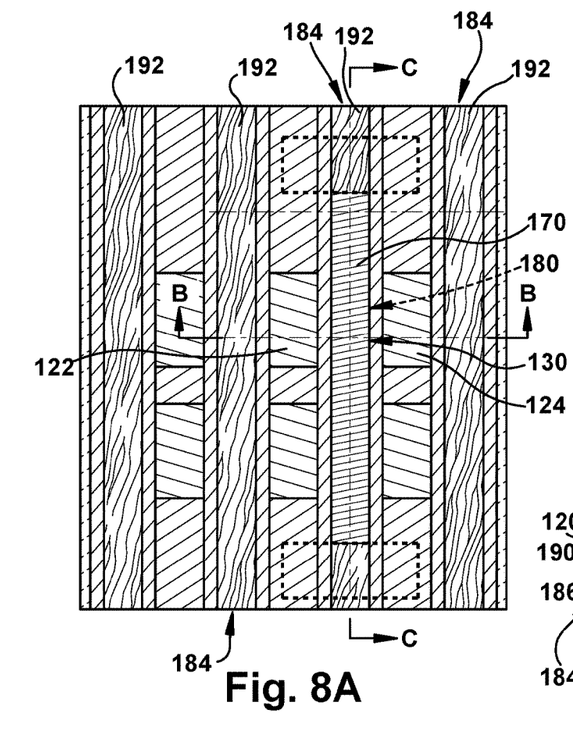
FIGS. 8A-B show a plan and a cross-sectional view, respectively, of a replacement metal gate process according to embodiments of the disclosure.
Figure 8B:
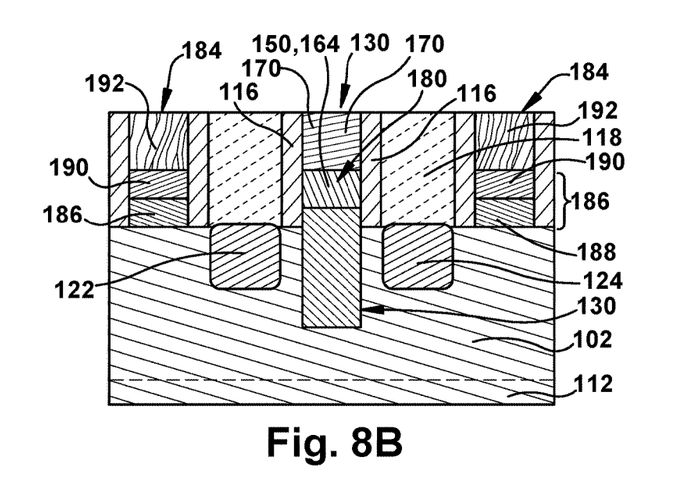
Figure 8C:
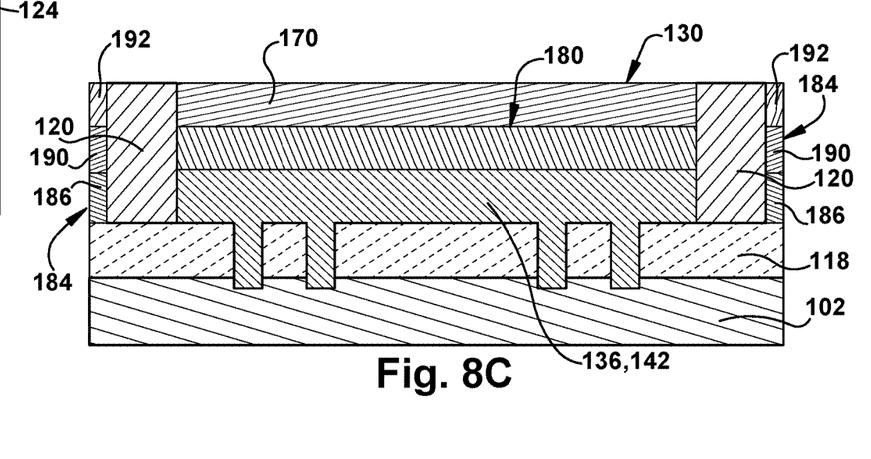

FIGS. 8A-B show a conventional replacement metal gate (RMG) process in which dummy gates 114 are removed and replaced with high-K metal gates 184, per conventional processing. This RMG process may include any now known or later developed RMG process. In one example, this process may include, after forming dielectric cap layer 170 over metal alloy resistor material 150 and prior to forming contacts 200, 202 (FIGS. 9A-C), replacing dummy gate 114 with a high dielectric constant (high-K) metal gate stack 186 (FIG. 8B). High-K metal gate stack 186 may include any now known or later developed metal gate structures. In one example, as shown in FIG. 8B, high-K metal gate stack 186 may include a high-K liner (not labeled), a work function metal (WFM) 188 and a metal body 190. Examples of high-K layer material (having K higher than silicon oxide) include but are not limited to: metal oxides such as $Ta_2O_5$, $BaTiO_3$, $HfO_2$, $ZrO_2$, $Al_2O_3$, or metal silicates such as HfSixOy or HfSixOyNz, where x, y, and z represent relative proportions, each greater than or equal to zero and x+y+z=1 (1 being the total relative mole quantity). As understood in the art, WFM 188 may include a work function metal (WFM) for a particular type of FET, i.e., n-type or p-type. That is, WFM 188 may include a PFET work function metal or an NFET work function metal, depending on what type of FET is being built. Example WFMs include but are not limited to: aluminum (Al), zinc (Zn), indium (In), copper (Cu), indium copper (InCu), tin (Sn), tantalum (Ta), tantalum nitride (TaN), tantalum carbide (TaC), titanium (Ti), titanium nitride (TiN), titanium carbide (TiC), TiAlC, TiAl, tungsten (W), tungsten nitride (WN), tungsten carbide (WC), polycrystalline silicon (poly-Si), and/or combinations thereof. The depositing steps may include, for example, CVD, ALD, PECVD, etc. Metal body 190 may include any now known or later developed gate metal such as but not limited to tungsten (W) or cobalt (Co). Metal body 190 may be formed using any appropriate deposition process for the metal, perhaps followed by a planarization step. High-K metal gate 184, i.e., metal body 190, may then be recessed, e.g., via a RIE, and a cap 192 formed on metal gate 184. Cap 192 may include any now known or later developed dielectric cap for a metal gate, e.g., silicon nitride ($Si_3N_4$).

Figure 9A:
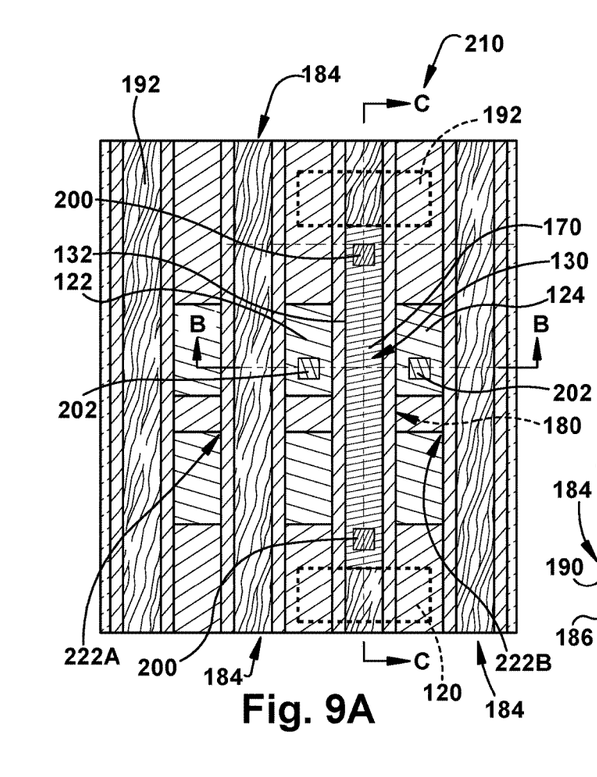
FIGS. 9A-C show a plan and two cross-sectional views, respectively, of forming contacts for a resistor, the resistor and an IC including the resistor, according to embodiments of the disclosure.
Figure 9B:
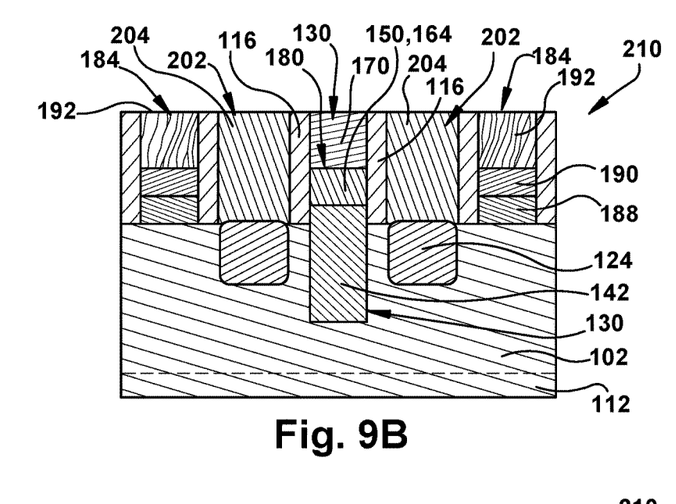
Figure 9C:
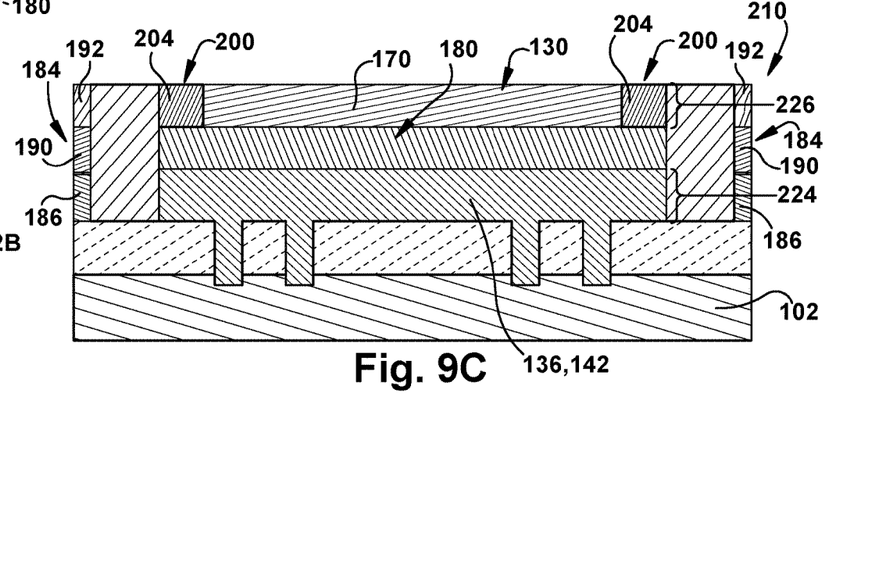

FIGS. 9A-C show forming a pair of contacts 200 to metal alloy resistor material 150 through dielectric cap layer 170, i.e., after the RMG process. Contacts 200 can be formed at any location desired along a length of metal alloy resistor material 150, so as to customize the length and resistance of resistor 180. As shown in FIGS. 9A-B, the process of forming pair of contacts 200 to metal alloy resistor material 150 may further include forming a contact 202 to each of source/drain regions 122, 124. Contacts 200, 202 can be formed using any now known or later developed process. In one example, a mask (not shown) including contact openings is formed, and an etch is performed to create openings to metal alloy resistor material 150 and/or S/D regions 122, 124. Each contact 200, 202 may be formed by depositing a refractory metal liner (not labeled, e.g., tantalum (Ta), titanium (Ti), tungsten (W), iridium (Ir), rhodium (Rh) and platinum (Pt), etc., or mixtures of thereof) in the contact openings, and then depositing a conductor 204, e.g., copper. A planarization step may follow to remove excess material.

FIGS. 9A-C also show resistor 180 and an IC 210 including the resistor. IC 210 includes plurality of semiconductor fins 102 on substrate 112 with at least one semiconductor fin 102 (upper fin in FIG. 9A) being part of at least one finFET 222A, 222B. FinFETs 222A, 222B are formed by SDB 130. (It is noted that opposing source/drain regions of finFETs 222A, 222B are not labeled or omitted from FIG. 9A.) IC 210 also includes SDB 130 in a selected one of the plurality of semiconductor fins 102 (e.g., both fins in FIG. 9A). Resistor 180 includes metal alloy resistor body 164, i.e., remaining portion of metal alloy resistor material 150, positioned within SDB 130. Resistor 180 is "within" SDB 130 because it is embedded within SDB 130 on upper and lower ends and four sides thereof. SDB 130 includes dielectric portion 142 in a lower region 224 thereof, and resistor 180 is positioned in an upper region 226 of SDB 130 over lower region 224. As shown in FIG. 9B, spacers 116 close off two opposing sides of resistor 180, as part of SDB 180. Dielectric cap layer 170 completes an upper end of SDB 130, i.e., closes off upper region 226 of SDB 130. In one embodiment, shown in FIG. 9C, gate cut isolations 120 are shown to form right and left ends of SDB 130, i.e., they form left and right end walls of SDB 130 where it meets left and right ends of metal alloy resistor material 150. However, as shown in FIG. 7C, where resistor opening 140 is not formed as the same size of SDB opening 132, dielectric 136 forms left and right end walls of SDB 130 where it meets left and right ends of metal alloy resistor material 150. As shown in FIG. 9A, SDB 130 provides an isolation region in semiconductor fin 102 between pair of finFETs 222A, 222B, i.e., below gates 184 over semiconductor fin(s) 102. Resistor 180 includes pair of contacts 200 to metal alloy resistor body 150 through dielectric cap layer 170. Resistor 180 includes resistive metal alloy material 150 such as: tungsten silicide and tungsten polysilicon. Each resistor 180, as shown best in FIG. 9A, extends parallel to gates 184.

Resistor 180 within SDB 130 allows for the resistor to be built at FEOL layers. That is, resistor 180 can be built in the same layers as gates 184 (FEOL), which saves on space, and can improve yield of MOL and BEOL layers because the resistors may not need to be built in those layers. The location and process described herein also reduce expense by eliminating additional mask processes, i.e., at MOL layers. In addition, resistor 180 position in the FEOL layers, rather than the conventional MOL layers, allows use of transistors 222A, 222B (FIG. 9A) that would normally be blocked from use by the resistor, i.e., because they would be below the resistor. Formation of resistor 180 in SDB 130 at the FEOL layers also allows for the greater critical dimension (CD) precision typically observed at those layers to be applied to more precisely dimension the resistor and select its resistance.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. An integrated circuit (IC), comprising:
   a plurality of semiconductor fins on a substrate, at least one semiconductor fin being part of at least one finFET;
   a single diffusion break (SDB) in a selected one of the plurality of semiconductor fins; and
   a resistor positioned within the SDB.

2. The IC of claim 1, wherein the resistor includes a resistive metal alloy.

3. The IC of claim 2, wherein the resistive metal alloy is selected from the group consisting of: tungsten silicide and tungsten polysilicon.

4. The IC of claim 1, wherein the SDB includes a dielectric in a lower region thereof, and wherein the resistor is positioned in an upper region of the SDB over the lower region.

5. The IC of claim 1, further comprising a dielectric cap layer over the resistor, and a pair of contacts to the resistor through the dielectric cap layer.

6. The IC of claim 1, further comprising a plurality of gates extending perpendicularly across the plurality of semiconductor fins to form fin-type field effect transistors (finFETs), wherein each of the plurality of gates has a gate width, and the resistor has a width no greater than the gate width.

7. The IC of claim 1, wherein the resistor and the SDB are positioned between a pair of spaced gate cut isolations.

8. A resistor for an integrated circuit (IC), the resistor comprising:
   a metal alloy resistor body positioned within a single diffusion break (SDB), the SDB providing an isolation region in a semiconductor fin between a pair of fin-type field effect transistors (finFETs).

9. The resistor of claim 8, wherein the resistor includes a resistive metal alloy.

10. The resistor of claim 9, wherein the resistive metal alloy is selected from the group consisting of: tungsten silicide and tungsten polysilicon.

11. The resistor of claim 8, wherein the SDB includes a dielectric portion in a lower region thereof, and the resistor is positioned in an upper region of the SDB over the lower region.

12. The resistor of claim 11, wherein the SDB further includes a dielectric cap layer over the metal alloy resistor body, and a pair of contacts to the metal alloy resistor body through the dielectric cap layer.

* * * * *